United States Patent
Schenk et al.

(10) Patent No.: US 12,117,822 B2
(45) Date of Patent: Oct. 15, 2024

(54) METHOD AND SYSTEM FOR MANAGING ALARMS IN MODULAR PRODUCTION INSTALLATIONS

(71) Applicant: Siemens Aktiengesellschaft, Munich (DE)

(72) Inventors: Tim Schenk, Landshut (DE); Andrés Botero Halblaub, Kirchseeon (DE); Andreas Stutz, Eggenstein-Leopoldshafen (DE); Mathias Maurmaier, Gerlingen (DE); Till Heinzerling, Stutensee (DE); Christoph Wincheringer, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 18/562,811

(22) PCT Filed: May 11, 2022

(86) PCT No.: PCT/EP2022/062815
§ 371 (c)(1),
(2) Date: Nov. 20, 2023

(87) PCT Pub. No.: WO2022/248228
PCT Pub. Date: Dec. 1, 2022

(65) Prior Publication Data
US 2024/0231348 A1    Jul. 11, 2024

(30) Foreign Application Priority Data
May 28, 2021    (EP) .................................... 21176513

(51) Int. Cl.
G05B 23/02    (2006.01)
G06F 30/20    (2020.01)

(52) U.S. Cl.
CPC .......... G05B 23/027 (2013.01); G06F 30/20 (2020.01); G05B 2223/04 (2018.08)

(58) Field of Classification Search
CPC .... G05B 23/027; G05B 2223/04; G06F 30/20
See application file for complete search history.

(56) References Cited

U.S. PATENT DOCUMENTS 5,249,372 A * 10/1993 Wedel ................. D21G 9/0063
                                                    34/117
6,571,285 B1 * 5/2003 Groath .................... H04L 43/00
                                                    709/224

(Continued)

FOREIGN PATENT DOCUMENTS

EP    3650970 A1    5/2020

OTHER PUBLICATIONS

Bloch Henry et al: "Orchestration of Services in Modular Process Plants", IECON 2018—44th Annual Conference of the IEEE Industrial Electronics Society, IEEE, pp. 2935-2940, XP033483985, DOI: 10.1109/IECON.2018.8591300; [gefunden am Dec. 26, 2018]; the whole document; 2018.

(Continued)

Primary Examiner — Ramesh B Patel
(74) Attorney, Agent, or Firm — Schmeiser, Olsen & Watts LLP

(57) ABSTRACT

To automate alarm management in modular production installations, provided is, with respect to a modular production installation, for which, for its modular, manufacturer-independent construction and operation, "process equipment assembly" modules, controlled by a programmable PEA controller and simulated by means of a configurable PEA simulation, are integrated into the production installation, by means of a "module type package <MTP>" mechanism for the PEA module description, in the course of a process orchestration which is standardized the following is carried (Continued)

out in the alarm management: —all states of the modular production installation with respect to triggered faults of possible fault cases of the production installation are virtually run through and simulated; —simulation faults that occur are logged concomitantly by means of alarms, which provide identification and an alarm message log is created and/or alarm chains are identified and alarm relationships in the alarm chains are determined.

12 Claims, 1 Drawing Sheet

(56) References Cited

U.S. PATENT DOCUMENTS

| | | | |
|---|---|---|---|
| 6,985,901 B1* | 1/2006 | Sachse | H04L 41/5032 709/224 |
| 8,352,049 B2* | 1/2013 | Hsiung | G05B 23/0221 706/14 |
| 9,734,169 B2* | 8/2017 | Redlich | G06F 16/21 |
| 10,362,658 B2* | 7/2019 | Chemel | F21V 29/56 |
| 10,551,861 B2* | 2/2020 | Imes | H02J 3/38 |
| 11,537,186 B2* | 12/2022 | Raji | G08B 25/008 |
| 2006/0271821 A1* | 11/2006 | Pfeffer | G05B 19/4184 714/18 |
| 2007/0222576 A1* | 9/2007 | Miller | H04Q 3/0087 340/506 |
| 2010/0052924 A1* | 3/2010 | Bajpay | H04L 41/0613 340/635 |
| 2012/0119901 A1* | 5/2012 | Hollender | G05B 23/0272 340/501 |
| 2020/0073777 A1* | 3/2020 | Lutz | G05B 23/0278 |
| 2021/0287523 A1* | 9/2021 | Mr | G08B 29/16 |
| 2021/0397146 A1* | 12/2021 | Halblaub | G05B 19/41885 |
| 2022/0108262 A1* | 4/2022 | Cella | G06Q 10/063118 |

OTHER PUBLICATIONS

VDI/VDE/Namur-Richtlinie 2658; "Automation engineering of modular systems in the process industry", Verein Deutscher Ingenieure e.V., Düsseldorf, Oct. 2019.

Manca, Gianluca et al: "Detection of Historical Alarm Subsequences Using Alarm Events and a Coactivation Constraint",; IEEE Access, IEEE, USA; vol. 9, Mar. 22, 2021 (Mar. 22, 2021), pp. 4851-46873, XP011847045.

PCT International Search Report and Written Opinion of International Searching Authority mailed Aug. 19, 2022 corresponding to PCT International Application No. PCT/E P2022/062815 filed May 11, 2022.

* cited by examiner

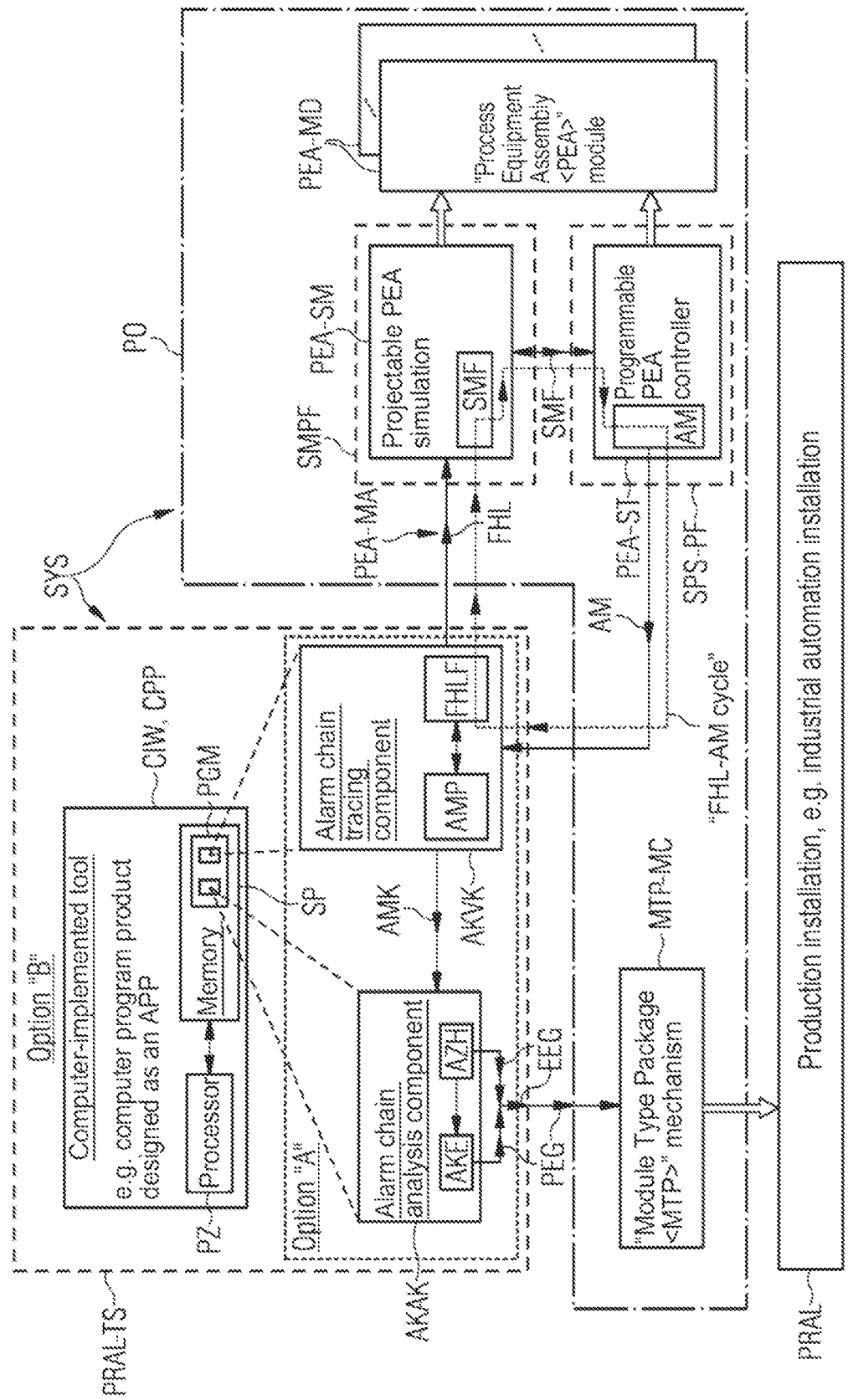

METHOD AND SYSTEM FOR MANAGING ALARMS IN MODULAR PRODUCTION INSTALLATIONS

CROSS-REFERENCE TO RELATED APPLICATIONS

This application claims priority to PCT Application No. PCT/EP2022/062815, having a filing date of May 11, 2022, which claims priority to EP Application No. 21176513.6, having a filing date of May 28, 2021, the entire contents both of which are hereby incorporated by reference.

FIELD OF TECHNOLOGY

The following relates to a method for managing alarms in modular production installations and a system for managing alarms in modular production installations.

BACKGROUND

Modular production installations are being used increasingly in manufacturing and process engineering, wherein the manufacturing and process engineering and modular automation are interlinked. Using the modular design, planning time and engineering outlays both of new installations and in the retrofitting of existing installations can clearly be reduced. Especially with respect to the retrofitting operations of "old" installations carrying this out quickly should plays an important role if the aim is to shorten downtimes and also the time to market. Modular engineering with a view to modular automation has hitherto not been possible, because it was not possible to use controllers of different manufacturers in a production installation.

However, in order to enable continuous modular engineering and modular automation, a standard is defined with a VDI/VDE/NAMUR directive 2658, in which "Process Equipment Assembly <PEA>" modules, by means of which standard PEA module automation can be described in a manufacturer-independent manner and PEA modules of various manufacturers can be integrated with PEA controllers into a "Process Orchestration Layer <POL>" in the course of process orchestration. The integration of the PEA modules takes place in this case by means of a "Module Type Package <MTP>" mechanism which is created by the PEA manufacturer and using which all necessary information of a "Process Equipment Assembly <PEA>", a PEA operating screen as structural description, services as encapsulated process functionalities and e.g. Alarm and diagnostic aspects are described.

In modular production installations, alarm management is furthermore becoming ever more important, as the installation structure often changes and therefore building experience proves to be more difficult. One option for improving this is a model for describing alarm chains, which is likewise described in the standard VDI/VDE/NAMUR 2658. This model can be used by the PEA modules to describe the module-internal alarm chains and to provide the alarm chains both to a production installation controller and an operator of the production installation. To this end, it is necessary however that the PEA manufacturer must first determine the alarm chains and then convert the determined alarm chains to the standardized format.

One option for achieving this consists in the PEA manufacturer, by means of their expert knowledge and by manually tracing the alarm chains, accordingly determining these alarm chains and subsequently manually performing the detection according to the standard.

A method and a device for computer-aided simulation of a modular technical system, in which a corresponding virtual model is generated for a respective real module of the modular technical system, are known from EP 3 650 970 A1. The virtual module contains a controller for controlling a module-specific process and at least one module-specific simulation model with associated model type information for simulating the module-specific process. The virtual module is set up in such a manner to replicate the module-specific process controlled by the controller by means of the module-specific simulation model and/or the controller of the real module and it is provided as data container for a computer-aided simulation of the modular technical system. The known method or system allows a virtual commissioning of modular process installations in particular. In this case, various operations, various system specifications and/or fault scenarios can be run through in particular.

It is known from the IEEE publication by MANCA GIANLUCA ET AL: "Detection of Historical Alarm Subsequences Using Alarm Events and a Coactivation Constraint", IEEE ACCESS, IEEE, USA, Vol. 9, Mar. 22, 2021 (2021/03/22), pages 46851-46873, to use the detection of historical partial alarm sequences for methods for analyzing alarm floods. In this case, compared to previous methods with their limitations for overcoming this, a novel approach is presented, which uses the detection of outliers in time distances between alarm events (activation and return to normal state) and an alarm coactivation constraint. This is based on a "Tennessee Eastman Process" as comparison standard in process automation. Here, the intention is pursued to provide a suitable dataset for the development and evaluation of alarm management methods in complex industrial processes using both quantitative and qualitative information from various sources. It is additionally shown that the integration of additional information is advantageous for overall performance and robustness in the proposed procedure. Thus, the proposed procedure allows a more precise detection of coherent historical abnormal situations, including phases with active causative faults and normalization phases which follow the end thereof. Furthermore, the proposed procedure has the advantage that the detection results are influenced less by the number of alarms, the propagation rate, the duration of the situation and the time distance between two causally independent situations compared to the approaches in the previous methods.

An orchestration of services in modular process plants is known from the IEEE publication by BLOCH, HENRY ET AL: "Orchestration of Services in Modular Process Plants", IECON 2018-44TH ANNUAL CONFERENCE OF THE IEEE INDUSTRIAL ELECTRONICS SOCIETY, IEEE, Oct. 21, 2018 (2018/10/21), pages 2935-2940, in which orchestration the modularization of the process plants is considered as an approach to taking account of the increasing flexibility requirements in the process industry. In this case, modules are combined to form a modular process plant in order to achieve a higher flexibility of the production, as conventional distributed control systems do not support an appropriate flexibility of production systems. The modules should encapsulate process functions as services. The services should be retrievable by means of a standards-based controller and controllable. The suggested orchestration contains an approach for standards-based control of the services according to a defined state model which has been tested in two case studies and two different implementations.

Thus, e.g. in a simulation environment based on Matlab Simulink Stateflow and in an industrial implementation of a pump and a controller.

SUMMARY

An aspect relates to specifying a method and a system for managing alarms in modular production installations, using which the alarm management in modular production installations is automated.

The idea on which embodiments of the invention are based consists—with respect to a modular production installation, e.g. an industrial automation, in which, for the modular, manufacturer-independent design and operation thereof, "Process Equipment Assembly <PEA>" modules (PEA-MD) are integrated into the production installation (PRAL) in a manner controlled by a programmable PEA controller (PEA-ST) and simulated using a projectable PEA simulation (PEA-SM) in the course of a process orchestration (PO), which is standardized according to the VDI/VDE/NAMUR 2658 standard in particular, by means of a "Module Type Package <MTP>" mechanism (MTP-MC) for PEA module description—in the case of alarm management in

- virtually running through and simulating all states of the modular production installation in relation to triggered faults of possible fault cases of the production installation,
- concomitantly logging the simulation faults which occur in this case by alarms that provide labeling, e.g. by signaling, in the form of alarm signals and creating an alarm signal log, and
- identifying alarm chains from the alarm signal log or identifying alarm chains and determining alarm correlations in the alarm chains.

In detail, the alarm management consists of the following seven measures:

(1) virtually triggering corresponding faults with respect to potential, known and retrievable fault cases of the production installation, wherein for each fault case, the fault is triggered virtually by a corresponding PEA module activation in the PEA simulation, (2) simulating a simulation case, which belongs to the fault which is virtually triggered in each case, by means of the PEA simulation, in which at least one simulation fault is determined in each case, (3) detecting the simulation fault by means of the programmable PEA controller, which thereupon executes all simulation-fault-based switching actions in accordance with its programming, (4) generating at least one alarm signal for alarm chain tracing for each detected simulation fault by means of the PEA controller, (5) detecting the alarm signals generated for all fault cases and logging the alarm signals by creating an alarm signal log, (6) analyzing the alarm signal log and, on the basis of this analysis, identifying alarm chains or identifying alarm chains and determining alarm correlations in the alarm chains, (7) passing analysis results and/or results of the determination to the "Module Type Package <MTP>" mechanism for the embedding thereof into the PEA module description.

Thus, in an alarm management system, the alarm management measures (1) and (5) can be executed in an alarm chain tracing component, the alarm management measure (2) can be executed in the course of the PEA simulation on a simulation platform, e.g. of the SIMIT type, the alarm management measures (3) and (4) can be executed in the course of the PEA control on a "Programmable Logic Controller <SPS>" platform, e.g. of the SIMATIC S7-1500 type, and the alarm management measures (6) and (7) are executed in an alarm chain analysis component.

The alarm chain tracing component and the alarm chain analysis component are in this case, in the course of the alarm management in the modular production installation, a constituent of a program module with control program commands which in a non-volatile, readable memory of a computer-implemented tool, which is a computer program product (non-transitory computer readable storage medium having instructions, which when executed by a processor, perform actions) that is designed e.g. as an APP and in addition to the memory has a processor, which is connected to the memory and which executes the control program commands of the program module, and/or, contained in a production installation test system, e.g. a "Factory Acceptance Tool <FAT>".

The alarm chain tracing component, which is e.g. designed as an alarm chain tracer, takes care of the targeted configuration and running through of each individual fault scenario and detects and logs all alarms that occur in their temporal sequence by means of the alarm signals generated by and received from the PEA controller. After running through all fault scenarios, the alarm signal log with the logged alarm signals is forwarded by the alarm chain tracing component or the alarm chain tracer to the alarm chain analysis component, which is designed e.g. as an alarm chain analyzer. This alarm chain analysis component or the alarm chain analyzer analyzes the alarm signal log and from that identifies the alarm chain and in the process passes the identified alarm chain to the "Module Type Package <MTP>" mechanism in accordance with the VDI/VDE/NAMUR 2658 standard for embedding the alarm chain into the PEA module description.

The alarm management carried out in this manner advantageously stands out in that

- the alarm chains are automatically detected and saved in the correct format.
- the alarm chains are detected completely, as due to the simulation of all fault states in the PEA simulation by means of a digital twin of the production installation, which consists of a model of sensors and actuators and processors and emulated PEA automation, an alarm chain is triggered that is identical to an alarm chain in the "genuine" production installation.
- both linear and interlinked alarm chains can be determined.
- if changes to the PLC code in a "Programmable Logic Controller <PLC>" are carried out, then it is only necessary for the existing automated alarm management measures to be carried out anew once and no manual analysis is required of what has changed due to the changes carried out and what effects these changes have.

BRIEF DESCRIPTION

Some of the embodiments will be described in detail, with reference to the following FIGURES, wherein like designations denote like members, wherein:

FIG. 1 shows a system for managing alarms in a modular production installation.

DETAILED DESCRIPTION

The FIGURE shows a system SYS for managing alarms in a modular production installation PRAL, which is designed e.g. as an industrial automation installation. For the alarm management, the system SYS has the following system components:
  (i) "Process Equipment Assembly <PEA>" modules PEA-MD for a modular, manufacturer-independent design and operation of the production installation PRAL,
  (ii) a "Programmable Logic Controller <SPS>" platform SPS-PF, e.g. of SIMATIC S7-1500 type, on which a programmable PEA controller PEA-ST, which controls <PEA> modules PEA-MD, can be executed,
  (iii) a simulation platform SPF, e.g. of SIMIT type, on which simulation platform a PEA simulation PEA-ST, which is projectable (e.g. for the alarm management) and simulates the <PEA> modules PEA-MD, can be executed and which simulation platform is functionally bidirectionally connected to the SPS platform SPS-PF,
  (iv) a "Module Type Package <MTP>" mechanism (MTP-MC), by means of which the PEA modules PEA-MD are integrated into the production installation PRAL in the course of a process orchestration PO, which is standardized in accordance with the VDI/VDE/NAMUR 2658 standard, for the PEA module description, and
  (v) a production installation test system PRAL-TS, e.g. a "Factory Acceptance Tool <FAT>", in which
    according to an option "A", an alarm chain tracing component AKVK and an alarm chain analysis component AKAK are contained, which interact functionally for the alarm management, or
    according to an option "B", a computer-implemented tool CIW, which is e.g. a computer program product CPP that is designed as an APP, having a non-volatile, readable memory SP, in which processor-readable control program commands of a program module PGM are stored, and a processor PZ, which is connected to the memory SP and which executes the control program commands of the program module PGM, wherein in the course of the alarm management, the program module PGM contains the functionally interacting alarm chain tracing component AKVK and alarm chain analysis component AKAK.

According to the option "A", the alarm chain tracing component AKVK and the alarm chain analysis component AKAK are contained as hardware components of the system SYS (hardware system components), while according to the option "B", the alarm chain tracing component AKVK and the alarm chain analysis component AKAK are contained as software components of the system SYS (software system components) in the program module PGM of the computer-implemented tool CIW or the computer program product CPP, which is designed as an APP.

In both cases—as illustrated in the FIGURE—the alarm chain tracing component AKVK and alarm chain analysis component AKAK, which are designed either as hardware system components or as software system components, are a constituent of the production installation test system PRAL-TS. It is however entirely possible, though not explicitly illustrated, to operate the hardware system components or software system components autonomously from the production installation test system PRAL-TS in the course of the alarm management.

In the course of this alarm management and the standardized process orchestration PO, with respect to all relevant or potential fault cases FHLF of the production installation PRAL with corresponding faults FHL that are stored in the alarm chain tracing component AKVK or are retrievable by the same, in the context of a "fault <FHL> alarm signal <AM> cycle", the corresponding fault for each fault case is triggered virtually in the alarm chain tracing component AKVK for the alarm management by a corresponding PEA module activation PEA-MA in the PEA simulation PEA-SM on the simulation platform SPF.

In the context of the "fault <FHL> alarm signal <AM> cycle", the PEA simulation PEA-SM on the simulation platform SPF thereupon simulates a simulation case belonging to the fault, which is triggered virtually in each case, and in the process determines at least one simulation fault SMF in each case.

The programmable PEA controller PEA-ST on the SPS platform SPS-PF again in the context of the "fault <FHL> alarm signal <AM> cycle" detects the simulation fault SMF via the functionally bidirectional connection to the PEA simulation PEA-SM on the simulation platform SPF and after that executes all simulation-fault-based switching actions in accordance with its programming. Subsequently, the programmable PEA controller PEA-ST generates at least one alarm signal AM for each detected simulation fault SMF on the basis of the executed simulation-fault-based switching actions for alarm chain tracing.

Subsequently, in the context of the "fault <FHL> alarm signal <AM> cycle", the alarm chain tracing component AKVK detects the alarm signals AM generated for all fault cases FHLF, logs the same in an alarm signal log AMP and passes the alarm signal log AMP to the alarm chain analysis component AKAK.

In the alarm chain analysis component AKAK, the alarm signal log AMP is initially analyzed and then alarm chains AKE are identified on the basis of this analysis.

Alternatively however, it is also possible that the alarm signal log AMP is initially analyzed again in the alarm chain analysis component AKAK and then on the basis of this analysis, alarm chains are identified again and alarm correlations AZH are additionally determined in the alarm chains AKE.

As results of the analysis or the analysis and the determination, the alarm chain analysis component AKAK generates analysis results AEG and/or the results of the determination EEG and passes these to the "Module Type Package <MTP>" mechanism MTP-MC for the embedding thereof into the PEA module description.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:
1. A method for managing alarms in modular production installations, in which for a modular manufacturer-independent design and operation of a production installation, 'product equipment assembly (PEA) modules are integrated into the production installation in a manner controlled by a programmable PEA controller and simulated using a projectable PEA simulation (PEA-SM) in a course of a standardized process orchestration by means of a module type package (MTP) mechanism for a PEA module description,
  wherein of corresponding, virtually triggered faults with respect to potential, stored or retrievable fault cases of the production installation, for each fault case, the corresponding fault is triggered virtually by a corresponding PEA module activation in the projectable PEA simulation, a simulation case, which belongs to the fault which is virtually triggered in each case, is simulated by means of the projectable PEA simulation and in a process at least one simulation fault is determined in each case, the simulation fault is detected by means of the programmable PEA controller, which thereupon executes all simulation-fault-based switching actions in accordance with programming, wherein:
- a) generating at least one alarm signal for alarm chain tracing for each detected simulation fault by means of the programmable PEA controller,
- b) detecting the alarm signals generated for all fault cases and logging the alarm signals with creation of an alarm signal log by means of alarm chain tracing,
- c) analyzing the alarm signal log and, on a basis of the analyzing, identifying alarm chains or identifying alarm chains and determining alarm correlations in the alarm chains by means of alarm chain analysis, and
- d) passing analysis results during the identification of the alarm chains or results of the determination during a determination of the alarm correlations in the alarm chains to the MTP mechanism for the embedding thereof into the PEA module description.

2. The method as claimed in claim 1, wherein
the virtual fault triggering, the alarm signal detection and logging and also the alarm log analysis with the alarm chain identification or with the alarm chain identification and the alarm correlation determination are carried out in a computer-implemented manner.

3. The method as claimed in claim 1, wherein
the virtual fault triggering, the alarm signal detection and logging, and the alarm log analysis with the alarm chain identification or with the alarm chain identification and the alarm correlation determination are carried out by a production installation test system.

4. The method as claimed in claim 1, wherein the production installation is an industrial automation installation.

5. The method as claimed in claim 1, wherein the process orchestration is standardized according to standard VDI/VDE/NAMUR 2658.

6. A system for managing alarms in modular production installations, comprising:
   process equipment assembly (PEA) modules for a modular, manufacturer-independent design and operation of a production installation,
   a programmable PEA controller which is executed on a programmable logic controller platform, by means of which the PEA modules are controlled,
   a projectable PEA simulation which is executed on a simulation platform, and using which the PEA modules are simulated, and
   a module type package (MTP) mechanism, by means of which the PEA modules are integrated into the production installation in a course of a standardized process orchestration for a PEA module description, the projectable PEA simulation, in which, of corresponding faults with respect to potential, stored or retrievable fault cases of the production installation, for each fault case, the corresponding fault is triggered virtually by a corresponding PEA module activation,
   wherein the projectable PEA simulation, which simulates a simulation case, which belongs to the fault which is virtually triggered in each case, and in the process determines at least one simulation fault in each case,
   wherein the programmable PEA controller, which detects the simulation fault and thereupon executes all simulation-fault-based switching actions in accordance with programming,
   wherein:
   - a) the programmable PEA controller, which generates at least one alarm signal for alarm chain tracing for each detected simulation fault,
   - b) an alarm chain tracing component, which detects the alarm signals generated for all fault cases, logs the same in an alarm signal log and passes the alarm signal log to an alarm chain analysis component,
   - c) the alarm chain analysis component, which analyzes the alarm signal log and, on a basis of an analysis of the alarm chain analysis component, identifies alarm chains or identifies alarm chains and determines alarm correlations in the alarm chains,
   - d) the alarm chain analysis component passes the analysis results during the identification of the alarm chains or results of a determination during the determination of the alarm correlations in the alarm chains to the MTP mechanism for the embedding thereof into the PEA module description.

7. The system as claimed in claim 6, wherein a computer-implemented tool having a non-volatile, readable memory, in which processor-readable control program commands of a program module are stored, and a processor, which is connected to the memory and which executes the control program commands of the program module, wherein in the course of the alarm management, the program module contains the alarm chain tracing component and the alarm chain analysis component.

8. The system as claimed in claim 6, wherein a production installation test system, in which the alarm chain tracing component and the alarm chain analysis component, are contained.

9. The system as claimed in claim 6, wherein the production installation is an industrial automation installation.

10. The system as claimed in claim 6, wherein for each fault case, the alarm chain tracing component triggers the corresponding fault virtually by means of the corresponding PEA module activation.

11. The system as claimed in claim 6, wherein the process orchestration is standardized according to standard VDI/VDE/NAMUR 2658.

12. The system as claimed in claim 7, wherein the computer-implemented tool is a computer program product, comprising a computer readable hardware storage device having computer readable program code stored therein, said program code executable by a processor of a computer system to implement a method, that is designed.

* * * * *